(12) United States Patent
Chen

(10) Patent No.: US 8,772,151 B2
(45) Date of Patent: Jul. 8, 2014

(54) PASSIVATION SCHEME

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/629,180

(22) Filed: Sep. 27, 2012

(65) Prior Publication Data

US 2014/0084464 A1 Mar. 27, 2014

(51) Int. Cl.
*H01L 21/44* (2006.01)

(52) U.S. Cl.
USPC .... 438/612; 438/613; 438/637; 257/E21.577; 257/E21.508

(58) Field of Classification Search
USPC ........... 438/613, 637; 257/E21.577, E21.508
See application file for complete search history.

(56) References Cited

U.S. PATENT DOCUMENTS

| | | | | |
|---|---|---|---|---|
| 6,998,335 | B2* | 2/2006 | Fan et al. | 438/612 |
| 8,004,092 | B2* | 8/2011 | Lin et al. | 257/781 |
| 2003/0232493 | A1* | 12/2003 | Mercado et al. | 438/614 |
| 2008/0265413 | A1* | 10/2008 | Chou et al. | 257/737 |
| 2010/0207271 | A1* | 8/2010 | Omi | 257/737 |
| 2011/0186987 | A1* | 8/2011 | Wang et al. | 257/737 |
| 2012/0049343 | A1* | 3/2012 | Schulze et al. | 257/737 |

\* cited by examiner

*Primary Examiner* — Julia Slutsker
(74) *Attorney, Agent, or Firm* — Slater and Matsil, L.L.P.

(57) ABSTRACT

A method includes forming a passivation layer over an electrically conductive pad. A stress buffer layer is formed over the passivation layer. An opening is formed through the stress buffer layer over the electrically conductive pad wherein the opening does not reach the electrically conductive pad. The stress buffer layer is cured. The opening is extended through the passivation layer to reach the electrically conductive pad after the curing.

20 Claims, 4 Drawing Sheets

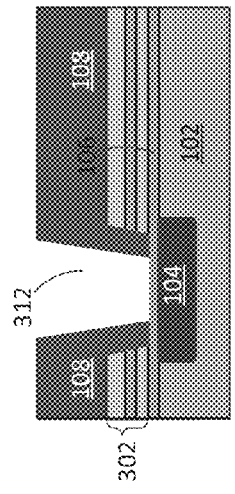
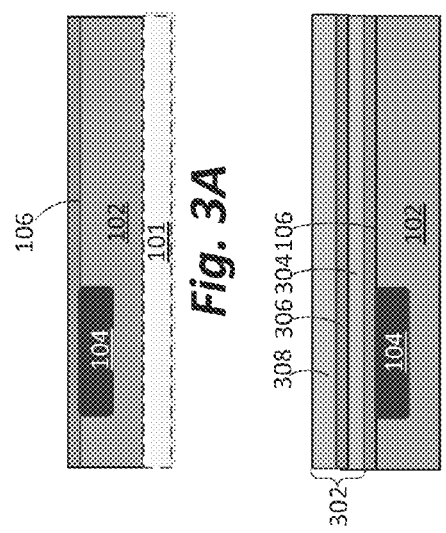
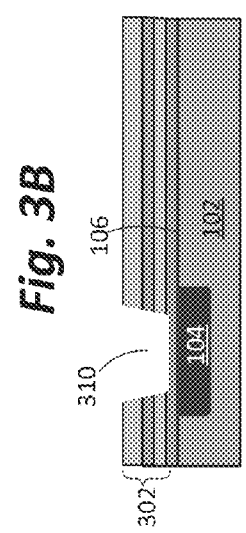
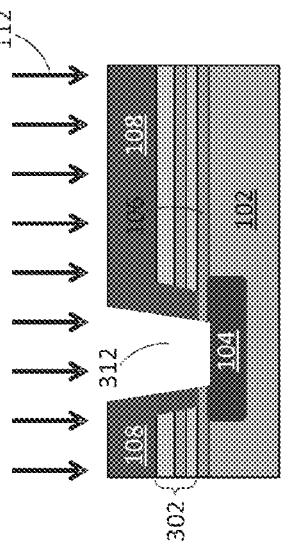
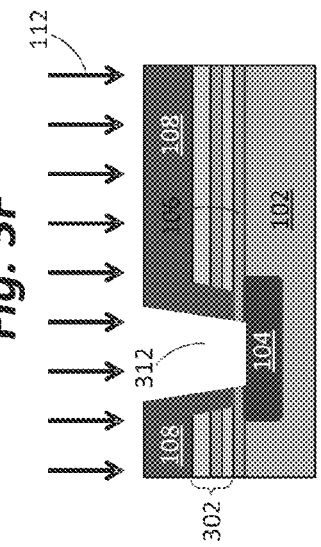
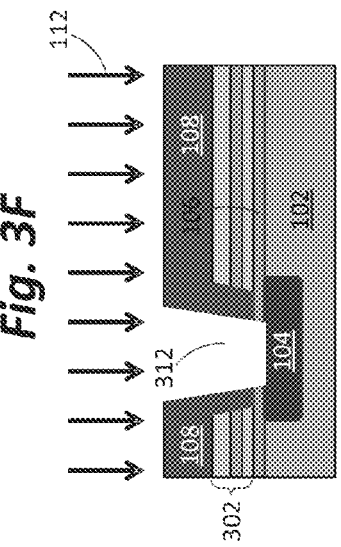

PASSIVATION SCHEME

TECHNICAL FIELD

The present disclosure relates generally to an integrated circuit and more particularly to a passivation scheme.

BACKGROUND

For some passivation layer processes, curing a passivation layer such as polymer can cause oxidation of exposed Cu (copper) pads. The Cu pad oxidation may result in poor interconnection on the Cu pad and degrade device or circuit performance.

BRIEF DESCRIPTION OF THE DRAWINGS

Reference is now made to the following descriptions taken in conjunction with the accompanying drawings, in which:

FIGS. 3A-3G are intermediate steps of another exemplary passivation scheme according to some embodiments.

DETAILED DESCRIPTION

Figure 1D:
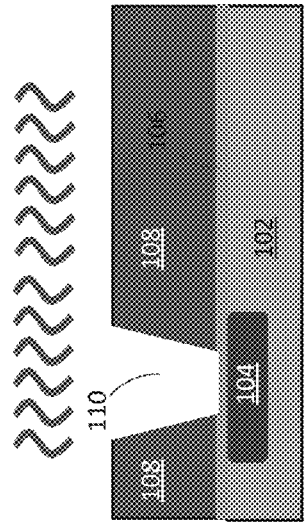
FIGS. 1A-1E are intermediate steps of an exemplary passivation scheme according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1E:
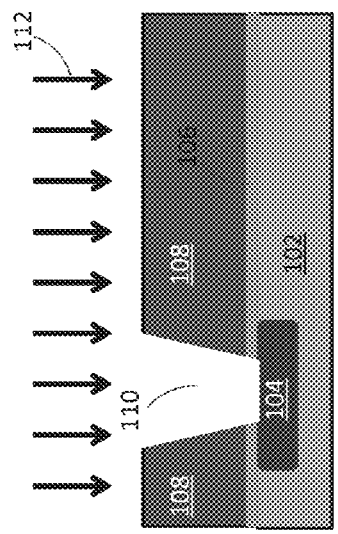
Figure 1A:
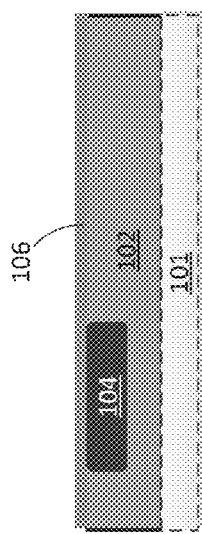

FIGS. 1A-1E are intermediate steps of an exemplary passivation scheme according to some embodiments. In FIG. 1A, a first passivation layer 106 ("liner") is formed over an electrically conductive pad 104 ("pad") and dielectric layer 102. For example, the liner 106 can be deposited by chemical vapor deposition (CVD). The dielectric layer 102 is disposed over a substrate 101 (not shown in subsequent figures for simplicity). The dielectric layer 102 comprises SiO$_2$, for example, and can be inter layer dielectric (ILD) or inter metallic dielectric (IMD) in some embodiments.

The substrate 101 can have electrical devices or components (e.g., transistors, resistors, capacitors, etc.) formed on the surface in some embodiments. The substrate 101 comprises silicon, silicon dioxide, silicon on insulator (SOI), aluminum oxide, sapphire, germanium, gallium arsenide (GaAs), an alloy of silicon and germanium, indium phosphide (InP), or any other suitable material. The pad 104 comprises copper or copper alloy in some embodiments.

The liner 106 is an etch stop layer and prevents moisture absorption. The liner 106 comprises SiN, SiON, SiO2, tetraethyl orthosilicate (TEOS), any combination thereof, or any other suitable material. The liner 106 has a thickness that ranges from 500 Å to 1500 Å in some embodiments. In one example, the liner 106 comprises SiN and has a thickness of about 750 Å. If the thickness of the liner 106 is too thick, it may be difficult to form an opening through the liner 106 later for interconnections. If the thickness of the liner 106 is too thin, the liner 106 may not be effective as an etch stop layer during some etching process and also it provides less stress buffer.

Figure 1B:
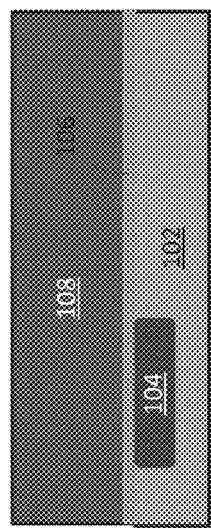

In FIG. 1B, a stress buffer layer 108 is formed (deposited) over the liner 106. For example, the buffer layer 108 can be deposited by CVD. The stress buffer layer 108 provides a stress buffer and comprises polymer such as polyimide in some embodiments. The stress buffer layer 108 has a thickness that ranges from 5 μm to 20 μm in some embodiments. An exemplary stress buffer layer 108 in some applications has a glass transition temperature range from 200° C. to 380° C., an elongation range from 30% to 150%, and a coefficient of thermal expansion range from 30 ppm/K to 70 ppm/K. In other embodiments, the stress buffer layer 108 may have different properties.

Figure 1C:
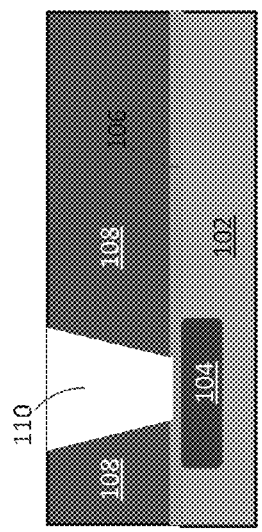

In FIG. 1C, an opening 110 is formed through the stress buffer layer 108 over the electrically conductive pad 104 by photolithography. The opening 110 does not reach the electrically conductive pad 104, stopped by the liner 106.

In FIG. 1D, the stress buffer layer 108 is cured. A heat treatment is performed on the stress buffer layer 108 in some embodiments. For example, the curing process is conducted in an oven with inert gas (N$_2$) or vacuum system with a curing time ranging from 60 min to 150 min and a curing temperature ranging from 150° C. to 350° C.

In FIG. 1E, the opening 110 is extended through the liner 106 to reach the pad 104 by self-aligned etching (after the curing in FIG. 1D). The liner 106 is etched (removed) while the buffer layer 108 functions as a mask and there is no additional photolithography process to define the etch location. The arrows 112 in FIG. 1E indicate an anisotropic plasma etch process, for example.

Figure 2:
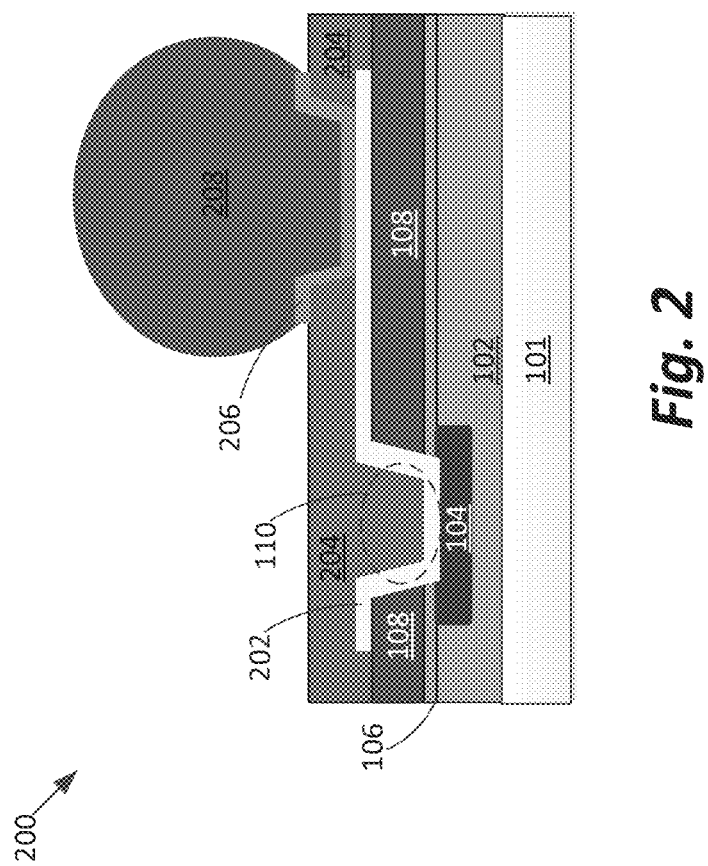
FIG. 2 is a schematic diagram of an exemplary integrated circuit using the passivation scheme in FIGS. 1A-1E according to some embodiments.

FIG. 2 is a schematic diagram of an exemplary integrated circuit 200 using the passivation scheme in FIGS. 1A-1E according to some embodiments. The integrated circuit 200 includes the substrate 101, the dielectric layer 102, and the pad 104 disposed over the substrate 101.

The substrate 101 can comprise silicon, silicon dioxide, silicon on insulator (SOI), aluminum oxide, sapphire, germanium, gallium arsenide (GaAs), an alloy of silicon and germanium, indium phosphide (InP), or any other suitable material. The pad 104 comprises copper or copper alloy in some embodiments. The dielectric layer 102 comprises SiO$_2$, for example, and can be inter layer dielectric (ILD) or inter metallic dielectric (IMD) in some embodiments.

The liner 106 disposed over the pad 104 is an etch stop layer and prevents moisture absorption. The liner 106 comprises SiN, SiON, SiO2, tetraethyl orthosilicate (TEOS), any combination thereof, or any other suitable material. The liner 106 has a thickness that ranges from 500 Å to 1500 Å in some embodiment. In one example, the liner 106 comprises SiN and has a thickness of about 750 Å. If the thickness of the liner 106 is too thick, it may be difficult to form an opening through the liner 106 later for interconnections. If the thickness of the liner 106 is too thin, it may not be effective as an etch stop layer during some etching processes and it provides less stress buffer.

The stress buffer layer 108 is disposed over the liner 106 and functions as a stress buffer. The stress buffer layer 108 comprises polymer such as polyimide in some embodiments. The stress buffer layer 108 has a thickness that ranges from 5 μm to 20 μm in some embodiments. An exemplary stress buffer layer 108 in some applications has a glass transition temperature range from 200° C. to 380° C., an elongation range from 30% to 150%, and a coefficient of thermal expansion range from 30 ppm/K to 70 ppm/K. In other embodiments, the stress buffer layer 108 may have different properties.

The opening 110 through the liner 106 and the stress buffer layer 108 is made so that an interconnect layer 202 can be formed directly over the pad 104 through the opening 110 and over the stress buffer layer 108. The stress buffer layer 108 does not have a physical contact with the pad 104 in the opening 110. In comparison, for some other processes not using the self-aligned etch process in FIG. 1E, the stress buffer layer 108 may have a physical contact with the pad 104 in the opening 110 and there can be metal oxidation issue on the pad 104.

Another stress buffer layer 204 is disposed over the interconnection layer 202 and the stress buffer layer 108. The stress buffer layer 204 comprises polymer such as polyimide in some embodiments. The stress buffer layer 204 has a thickness that ranges from 5 μm to 20 μm in some embodiments. Under bump metal layer 206 is disposed over the interconnection layer 202 and the stress buffer layer 204 to provide electrical connection to a solder bump 208. The solder bump 208 can be a micro-bump or a solder ball for a ball grid array (BGA), for example.

FIGS. 3A-3G are intermediate steps of another exemplary passivation scheme according to some embodiments. In FIG. 3A, a first passivation layer 106 ("liner") is formed over an electrically conductive pad 104 ("pad") and a dielectric layer 102. For example, the liner 106 can be deposited by chemical vapor deposition (CVD). The dielectric layer 102 is disposed over a substrate 101 (not shown in subsequent figures for simplicity). The dielectric layer 102 comprises $SiO_2$, for example, and can be inter layer dielectric (ILD) or inter metallic dielectric (IMD) in some embodiments.

The substrate 101 can have electrical devices or components (e.g., transistors, resistors, capacitors, etc.) formed on the surface in some embodiments. The substrate 101 comprises silicon, silicon dioxide, silicon on insulator (SOI), aluminum oxide, sapphire, germanium, gallium arsenide (GaAs), an alloy of silicon and germanium, indium phosphide (InP), or any other suitable material. The pad 104 comprises copper or copper alloy in some embodiments.

The liner 106 is an etch stop layer and prevents moisture absorption. The liner 106 comprises SiN, SiON, SiO2, tetraethyl orthosilicate (TEOS), any combination thereof, or any other suitable material. The liner 106 has a thickness that ranges from 500 Å to 1500 Å in some embodiment. In one example, the liner 106 comprises SiN and has a thickness of about 750 Å. If the thickness of the liner 106 is too thick, it may be difficult to form an opening through the liner 106 later for interconnections. If the thickness of the liner 106 is too thin, it may not be effective as an etch stop layer during some etching processes and also there is less stress buffer.

In FIG. 3B, additional passivation layer 302 is formed (deposited) over the liner 106. For example, the passivation layer 302 can be deposited by CVD. The additional passivation layer 302 may have one or more layers. The passivation layer 302 has a thickness ranging from 4 kilo-Angstroms (KÅ) to 12 KÅ in some embodiments. In one example, the liner 106 comprises SiN with a thickness of 750 Å, the passivation layer 302 includes a buffer layer 304 comprising SiO2 with a thickness of 4 KÅ, another etch stop layer 306 comprising SiN with a thickness of 750 Å, and another buffer layer 308 comprising SiO2 with a thickness of 4 KÅ.

In FIG. 3C, an opening 310 is formed through the additional passivation layers 302 by photolithography, for example. The opening 110 does not reach the pad 104, stopped by the liner 106.

In FIG. 3D, a stress buffer layer 108 is formed (deposited) over the liner 106 and the additional passivation layer 302. For example, the stress buffer layer 108 can be deposited by CVD. The stress buffer layer 108 provides a stress buffer and comprises polymer such as polyimide in some embodiments. The stress buffer layer 108 has a thickness that ranges from 5 μm to 20 μm in some embodiments. An exemplary stress buffer layer 108 has a glass transition temperature range from 200° C. to 380° C., an elongation range from 30% to 150%, and a coefficient of thermal expansion range from 30 ppm/K to 70 ppm/K in some applications. In other embodiments, the stress buffer layer 108 may have different properties.

In FIG. 3E, an opening 312 is formed through the buffer layer 108 over the electrically conductive pad 104 by photolithography, for example. The opening 312 does not reach the electrically conductive pad 104, stopped by the liner 106.

In FIG. 3F, the stress buffer layer 108 is cured. A heat treatment is performed on the stress buffer layer 108 in some embodiments. For example, the curing process is conducted in an oven with inert gas ($N_2$) or vacuum system with a curing time ranging from 60 min to 150 min and a curing temperature ranging from 150° C. to 350° C.

In FIG. 3G, the opening 312 is extended through the liner 106 to reach the pad 104 by self-aligned etching (after the curing in FIG. 3F). The liner 106 is etched (removed) while the buffer layer 108 functions as a mask and there is no additional photolithography process to define the etch location. The arrows 112 in FIG. 1E indicate an anisotropic plasma etch process, for example.

Figure 4:
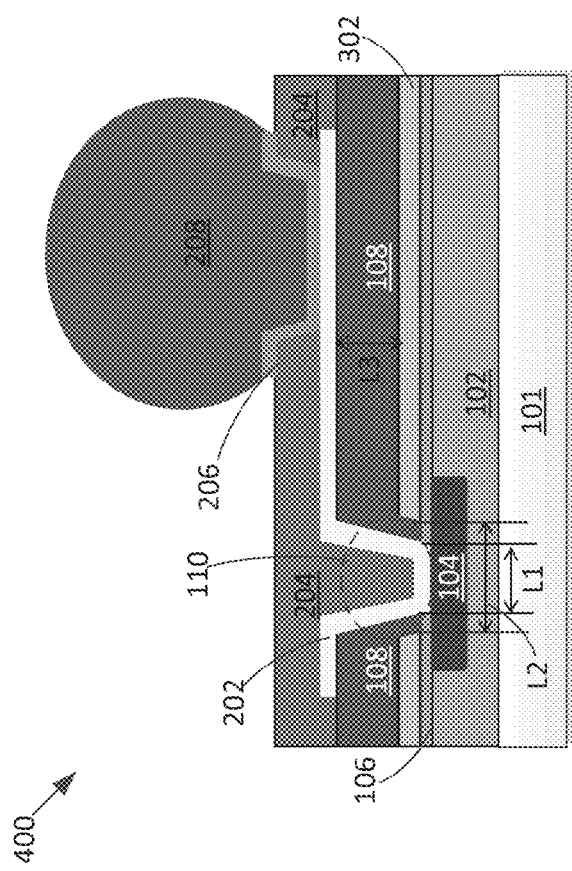
FIG. 4 is a schematic diagram of another exemplary integrated circuit using the passivation scheme in FIGS. 3A-3G according to some embodiments.

FIG. 4 is a schematic diagram of another exemplary integrated circuit 400 using the passivation scheme in FIGS. 3A-3G according to some embodiments. The integrated circuit 400 is similar to the integrated circuit 200 except that there is an additional passivation layer 302 for additional buffer. The opening diameter L1 on the liner 106 is about 10 μm or larger, and the opening diameter L2 on the additional passivation layer 302 is 20 μm or larger in some embodiments.

The stress buffer layer 108 does not contact the electrically conductive pad 104 because of the liner 106. In comparison, for some other processes not using the self-aligned etch process in FIG. 3G, the stress buffer layer 108 may have a physical contact with the pad 104 in the opening 110 and there can be metal oxidation issue on the pad 104.

In some embodiments, the passivation layer 302 comprises $SiO_2$ and has a thickness that ranges from 4 KÅ to 12 KÅ. In some embodiments, the passivation layer 302 comprises multiple layers. In one example, the liner 106 comprises SiN with a thickness of 750 Å, the passivation layer 302 includes a buffer layer comprising $SiO_2$ with a thickness of 4 KÅ, another etch stop layer comprising SiN with a thickness of 750 Å, and another buffer layer comprising SiO2 with a thickness of 4 KÅ.

According to some embodiments, a method includes forming a passivation layer over an electrically conductive pad. A stress buffer layer is formed over the passivation layer. An opening is formed through the stress buffer layer over the electrically conductive pad wherein the opening does not reach the electrically conductive pad. The stress buffer layer is cured. The opening is extended through the passivation layer to reach the electrically conductive pad after the curing.

According to some embodiments, an integrated circuit includes a substrate and an electrically conductive pad disposed over the substrate. A first passivation layer is disposed over the electrically conductive pad. A stress buffer layer is disposed over the first passivation layer. There is an opening through the first passivation layer and the stress buffer layer. An interconnect layer is formed directly over the electrically conductive pad through the opening and over the stress buffer layer. The stress buffer layer does not have a physical contact with the electrically conductive pad in the opening.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
    forming a first passivation layer over an electrically conductive pad;
    forming a second passivation layer over the first passivation layer;
    forming a first opening through the second passivation layer over the electrically conductive pad, wherein the first opening does not reach the electrically conductive pad;
    forming a stress buffer layer over the second passivation layer and in the first opening;
    forming a second opening through the stress buffer layer over the electrically conductive pad, wherein the second opening does not reach the electrically conductive pad;
    curing the stress buffer layer; and
    extending the second opening through the first passivation layer to reach the electrically conductive pad after the curing.

2. The method of claim 1, wherein extending the second opening is performed by self-aligned etching using the stress buffer layer as a mask.

3. The method of claim 1, wherein curing is performed by a heat treatment of the stress buffer layer.

4. The method of claim 1, wherein the electrically conductive pad comprises copper or copper alloy.

5. The method of claim 1, wherein the first passivation layer comprises SiN, SiON, $SiO_2$, tetraethyl orthosilicate (TEOS), or any combination thereof.

6. The method of claim 1, wherein the first passivation layer is formed to have a thickness that ranges from 500 Å to 1500 Å.

7. The method of claim 1, wherein the stress buffer layer comprises polymer.

8. The method of claim 1, wherein the stress buffer layer is formed to have a thickness that ranges from 5 μm to 20 μm.

9. The method of claim 1, wherein the second passivation layer comprises multiple layers.

10. The method of claim 1, wherein the second passivation layer is formed to have a thickness that ranges from 4 kilo-Angstroms (KÅ) to 12 KÅ.

11. A method, comprising:
    forming a first passivation layer over an electrically conductive pad, wherein the electrically conductive pad comprises copper or copper alloy and the passivation layer has a thickness that ranges from 500 Å to 1500 Å;
    forming a second passivation layer over the first passivation layer;
    forming a first opening through the second passivation layer over the electrically conductive pad, wherein the first opening does not reach the electrically conductive pad;
    forming a stress buffer layer comprising polymer over the second passivation layer and the first opening, wherein a bottom surface of the stress buffer layer directly adjoins the first passivation layer;
    forming a second opening through the stress buffer layer over the electrically conductive pad wherein the second opening does not reach the electrically conductive pad;
    curing the stress buffer layer; and
    extending the second opening through the first passivation layer to reach the electrically conductive pad by self-aligned etching using the stress buffer layer as a mask after the curing.

12. The method of claim 11, wherein the passivation layer comprises SiN, SiON, $SiO_2$, tetraethyl orthosilicate (TEOS), or any combination thereof.

13. The method of claim 11, wherein curing the stress buffer layer is performed by a heat treatment of the stress buffer layer.

14. A method comprising:
    forming a conductive pad over a first surface of a substrate;
    forming a first passivation layer over the first surface of the substrate;
    forming a second passivation layer over the first passivation layer;
    forming a first opening through the second passivation layer to the first passivation layer;
    forming a first stress buffer layer over the second passivation layer and in the first opening;
    forming a second opening through the first stress buffer layer to the first passivation layer, a first portion of the first buffer layer being between a sidewall of the first opening and a sidewall of the second opening;
    performing a treatment on the first stress buffer layer; and after performing the treatment on the first stress buffer layer, extending the second opening through the first passivation layer to expose a portion of the conductive pad.

15. The method of claim 14 further comprising:
forming a conductive interconnect in the second opening and along the first stress buffer layer, the conductive interconnect contacting the conductive pad in the second opening;
forming a conductive under bump layer on the conductive interconnect; and
forming a conductive bump on the conductive under bump layer.

16. The method of claim 15 further comprising forming a second stress buffer layer over the conductive interconnect, the conductive under bump layer extending through the second stress buffer layer.

17. The method of claim 14, wherein performing the treatment on the first stress buffer layer comprises curing the first stress buffer layer by a heat treatment.

18. The method of claim 14, wherein the first passivation layer comprises SiN, SiON, $SiO_2$, tetraethyl orthosilicate (TEOS), or any combination thereof, and wherein the first stress buffer layer comprises a polymer.

19. The method of claim 1, wherein the stress buffer layer directly adjoins the second passivation layer along a sidewall of the first opening.

20. The method of claim 14, wherein the first portion of the first stress buffer layer has a bottom surface directly adjoining a top surface of the first passivation layer, and wherein a sidewall of the second passivation layer directly adjoins the first portion of the first stress buffer layer.

* * * * *